United States Patent [19]

Rhoades

[11] Patent Number: 5,221,424
[45] Date of Patent: Jun. 22, 1993

[54] METHOD FOR REMOVAL OF PHOTORESIST OVER METAL WHICH ALSO REMOVES OR INACTIVATES COROSION-FORMING MATERIALS REMAINING FROM PREVIOUS METAL ETCH

[75] Inventor: Charles S. Rhoades, Los Gatos, Calif.

[73] Assignee: Applied Materials, Inc., Santa Clara, Calif.

[21] Appl. No.: 796,096

[22] Filed: Nov. 21, 1991

[51] Int. Cl.$^5$ ............................................. H01L 21/00
[52] U.S. Cl. .................................. 156/643; 156/646; 156/656; 156/664; 156/665; 156/668
[58] Field of Search ............... 156/656, 664, 665, 666, 156/668, 646, 643; 134/1-3, 30, 31; 427/309

[56] References Cited

U.S. PATENT DOCUMENTS

| | | | |
|---|---|---|---|
| 3,799,803 | 3/1974 | Kraus et al. | 427/309 |
| 4,325,984 | 4/1982 | Galfo et al. | 156/643 X |
| 4,501,061 | 2/1985 | Wonnacott | 156/665 X |
| 4,547,260 | 10/1985 | Takada et al. | 156/665 X |
| 4,668,335 | 5/1987 | Mockler et al. | 156/664 X |
| 4,695,327 | 9/1987 | Grebinski | 134/30 X |
| 4,778,536 | 10/1988 | Grebinski | 134/11 X |
| 4,867,799 | 9/1989 | Grebinski | 134/11 |
| 4,985,113 | 1/1991 | Fujimoto et al. | 156/643 |
| 5,007,981 | 4/1991 | Kawasaki et al. | 156/643 |
| 5,068,040 | 11/1991 | Jackson | 134/1 X |
| 5,100,476 | 3/1992 | Mase et al. | 134/1 |

Primary Examiner—Thi Dang
Attorney, Agent, or Firm—John P. Taylor

[57] ABSTRACT

A process is described for removing from an integrated circuit structure photoresist remaining after a metal etch which also removes or inactivates a sufficient amount of any remaining chlorine residues remaining from the previous metal etch to inhibit corrosion of the remaining metal for at least 24 hours. The process includes a first stripping step associated with a plasma, using either $O_2$ gas and one or more fluorocarbon gases, or $O_2$ gas and $N_2$ gas; followed by a subsequent step using a combination of $H_2O_2/H_2O$ vapors, $O_2$ gas, and optionally $N_2$ gas associated with a plasma. Preferably, the plasma is generated in a microwave plasma generator located upstream of the stripping chamber, and the stripping gases pass through this generator so that reactive species produced from the gases in the plasma enter the stripping chamber.

24 Claims, 1 Drawing Sheet

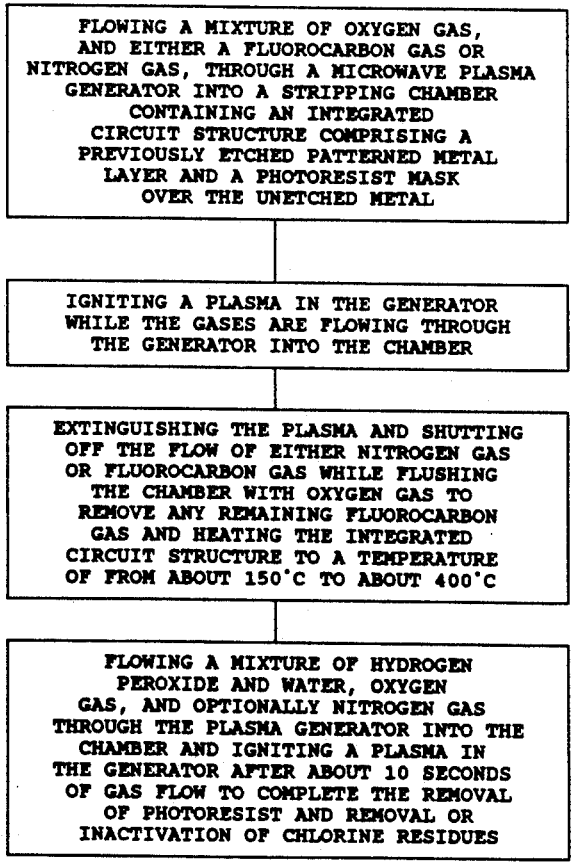

```
┌─────────────────────────────────────┐
│     FLOWING A MIXTURE OF OXYGEN GAS,│
│    AND EITHER A FLUOROCARBON GAS OR │
│  NITROGEN GAS, THROUGH A MICROWAVE PLASMA│
│     GENERATOR INTO A STRIPPING CHAMBER│
│           CONTAINING AN INTEGRATED  │
│         CIRCUIT STRUCTURE COMPRISING A│
│        PREVIOUSLY ETCHED PATTERNED METAL│
│          LAYER AND A PHOTORESIST MASK│
│             OVER THE UNETCHED METAL │
└─────────────────────────────────────┘
                    │
┌─────────────────────────────────────┐
│     IGNITING A PLASMA IN THE GENERATOR│
│     WHILE THE GASES ARE FLOWING THROUGH│
│       THE GENERATOR INTO THE CHAMBER│
└─────────────────────────────────────┘
                    │
┌─────────────────────────────────────┐
│    EXTINGUISHING THE PLASMA AND SHUTTING│
│     OFF THE FLOW OF EITHER NITROGEN GAS│
│      OR FLUOROCARBON GAS WHILE FLUSHING│
│         THE CHAMBER WITH OXYGEN GAS TO│
│        REMOVE ANY REMAINING FLUOROCARBON│
│          GAS AND HEATING THE INTEGRATED│
│       CIRCUIT STRUCTURE TO A TEMPERATURE│
│        OF FROM ABOUT 150°C TO ABOUT 400°C│
└─────────────────────────────────────┘
                    │
┌─────────────────────────────────────┐
│         FLOWING A MIXTURE OF HYDROGEN│
│            PEROXIDE AND WATER, OXYGEN│
│         GAS, AND OPTIONALLY NITROGEN GAS│
│       THROUGH THE PLASMA GENERATOR INTO THE│
│          CHAMBER AND IGNITING A PLASMA IN│
│      THE GENERATOR AFTER ABOUT 10 SECONDS│
│       OF GAS FLOW TO COMPLETE THE REMOVAL│
│           OF PHOTORESIST AND REMOVAL OR│
│       INACTIVATION OF CHLORINE RESIDUES│
└─────────────────────────────────────┘
```

METHOD FOR REMOVAL OF PHOTORESIST OVER METAL WHICH ALSO REMOVES OR INACTIVATES COROSION-FORMING MATERIALS REMAINING FROM PREVIOUS METAL ETCH

BACKGROUND OF THE INVENTION

1. Field of the Invention

This invention relates to a process for removing photoresist remaining over one or more metal layers after etching of the metal layer(s). More particularly, this invention relates to a dry process for removing photoresist and also removing or inactivating corrosion-forming etch residues remaining over or on the sidewalls of one or more metal layers after etching of such metal layer(s).

2. Description of the Related Art

A photoresist mask, which remains over portions of one or more metal layers on an integrated circuit structure after patterning such metal layers through the photoresist mask, has been conventionally removed by dry etch techniques using plasmas of oxygen and fluorocarbon gases. Such dry etch techniques are preferred over wet etch techniques since the underlying metals are not attacked, and because the dry etching is sometimes more effective in removal of photoresist residues, particularly when the photoresist has been altered by reactive ion etching, high temperature post bakes, or the like.

However, such dry etch techniques have been found to be less than satisfactory in removing or inactivating certain sidewall etch residues remaining from previous metal etch (patterning) step. Such metal etch processes conventionally use chlorine-based chemistry, e.g., $Cl_2$ and $BCl_3$, which may leave chlorine-containing residues on/in sidewalls of the photoresist mask and underlying metal layer portions after the metal etch.

If such chlorine-containing residues (regardless of their source) in the sidewall residues, remaining after the metal etch step, are not removed or inactivated during the subsequent removal of the photoresist mask, such chlorine-containing residues may cause corrosion of the underlying metal prior to subsequent downstream processing steps which may include washing (solvent rinse) steps resulting in removal of such chlorine-containing residues.

Since it is know that such subsequent processing steps can result in removal of any chlorine-containing residues remaining in sidewalls from the metal etch step, it has become conventional to judge the effectiveness of the photoresist removal step in also removing or inactivating such chlorine-containing residues based on how much corrosion occurs during a 24 hour period following the photoresist removal step. If no corrosion of the underlying metal occurs within 24 hours after the photoresist removal step, the photoresist removal step is judged to have successfully removed or inactivated a sufficient amount of such corrosion-causing residues, since it is assumed that within 24 hours the integrated circuit structure will have been subjected to subsequent processing which will include at least one subsequent washing step which will remove any remaining chlorine-containing residues.

However, the currently practiced dry photoresist removal process, using $O_2$ and one or more fluorocarbon gases such as $CF_4$, has not always succeeded in providing this desired 24 hours of protection from corrosion of the metal by such chlorine-containing residues.

It would, therefore, be desirable to provide an improved process for the removal of photoresist remaining after a metal etch step which would not only remove the photoresist mask, but also remove or inactivate a sufficient amount of any remaining chlorine-containing residues from the metal etching step so that the remaining metal or metals will be passivated or free from corrosion for at least 24 hours after such processing.

SUMMARY OF THE INVENTION

The invention comprises a process for removing photoresist remaining after a metal etch which also removes or inactivates a sufficient amount of any chlorine-containing residues remaining in sidewall residues from the metal etch step, to inhibit corrosion of the remaining metal or metals for at least 24 hours. The process includes a first stripping step, using a plasma and either a combination of $O_2$ gas and one or more fluorocarbon gases, or a combination of $O_2$ gas and $N_2$ gas; followed by a subsequent step using a mixture of $H_2O_2/H_2O$ vapors, $O_2$ gas, and optionally $N_2$ gas, and also associated with a plasma. A flushing step is used before the second step, when fluorocarbon gas is used during the first stripping step, to flush out any fluorocarbon gas remaining from the first step.

BRIEF DESCRIPTION OF THE DRAWING

The sole figure is a flow sheet illustrating the process of the invention.

DETAILED DESCRIPTION OF THE INVENTION

The process of the invention is utilized on an integrated circuit structure whereon a metal layer, or a composite of metal layers, has been previously deposited on the integrated circuit structure. For example, a composite of metal layers may comprise a titanium nitride barrier layer and an overlying aluminum layer, which have just been etched through a photoresist mask, leaving titanium nitride barrier portions and aluminum portions under the photoresist mask. After the metal etch step, sidewall etch residues remain on the sidewall surfaces of the photoresist mask, and on the sidewall surfaces of the remaining underlying metal layer portions. These sidewall etch residues, in turn, contain chlorine etch materials or residues therein which can cause corrosion of such metal portions.

In accordance with the invention, the chlorine-containing residues in such sidewalls are removed or inactivated and remaining metal portions of the metal layers are passivated during the process for the removal of the photoresist mask portions.

The metal layer or layers, partially removed during the preceding metal etch step to leave the patterned metal portions, may comprise any metal conventionally used in the formation of integrated circuit structures, such as, for example, aluminum, titanium, tungsten, etc. When multiple or composite metal layers are etched to form metal portions, the top layer may comprise an antireflective coating such as silicon, titanium nitride, or titanium tungsten; the main metal layer will usually comprise aluminum; and a metal layer underlying the main layer will comprise a barrier layer to prevent spiking of aluminum to underlying silicon contacts.

Examples of metals or metal-containing materials which may comprise such a barrier layer include titanium, titanium nitride, tungsten, and titanium tungsten. Such underlying electrically conductive metal-containing barrier materials will be referred to herein as metal layers, regardless of whether they comprise pure metals, metal alloys, or metal compounds.

The process of the invention finds greatest utility when the upper metal portions over the barrier layer comprise aluminum or any other metal which may be subject to corrosion by chlorine-containing residues, or other corrosion-forming metal etch step residues, if such residues are not removed during the photoresist removal step. By aluminum is meant either pure aluminum or an aluminum alloy such as, for example, an aluminum alloy containing 1-2 wt. % silicon and 0-4 wt. % copper.

In accordance with the practice of the invention, the integrated circuit structure (wafer) is removed from the metal etch chamber and placed in a vacuum stripping chamber, unless the same chamber is to be used for both processes. The stripping chamber is maintained at a pressure ranging from about 0.5 to about 3 Torr, typically about 2 Torr. The temperature of the wafer, upon removal of the wafer from the metal etch chamber, is usually within a range of from about 40° C. to about 100° C.

During the first stripping stage, a combination of $O_2$ and one or more fluorocarbon gases may be used with or without $N_2$ gas. The fluorocarbon gas may comprise, for example, $CF_4$, $CHF_3$, $C_2F_6$, $C_3H_2F_6$, $C_2H_4F_2$, or the like. However, the use of $CF_4$ gas is preferred. In some instances oxygen may be used with only nitrogen (no fluorocarbons) in this first stripping step.

The rate of flow of such gas or gases in this first step will be at a rate equivalent to a rate of from about 1000 to about 4000 standard cubic centimeters per minute (sccm), typically about 1400 sccm, of $O_2$; and either from about 20 sccm to about 150 sccm, typically about 100 sccm, of $N_2$; or from about 20 sccm to about 80 sccm, typically about 45 sccm, of the one or more fluorocarbon gases into a 5 liter stripping chamber. It will be understood, however, that typically either $N_2$ or fluorocarbon gas must be present, but usually not both.

A plasma having a power level of about 500 watts to about 5000 watts, typically about 1400 watts, is then ignited in the gas flow, preferably upstream of the stripping chamber, and maintained for a period of time of from about 10 seconds to about 20 seconds during this first stripping step after which the plasma may be extinguished.

Any type of conventionally generated plasma may, in general, be used in the practice of the invention, e.g., a conventional RF powered plasma generated between parallel electrodes in the stripping chamber. Preferably, however, the plasma used in the process of the invention is generated by a microwave plasma generator such as, for example, a Model AURA plasma generator commercially available from the GaSonic division of Atomel Corporation of Sunnyvale, Calif., which is located upstream of the stripping chamber.

In this type of apparatus, the gas or gases (and/or vapors) flowing toward the stripping chamber first pass through the microwave plasma generator located upstream of the stripping chamber and the plasma generated therein produces reactive species from the gases (and/or vapors) flowing through the plasma generator to the stripping chamber, and such reactive species then flow into the stripping chamber.

All such plasma generation will be generally referred to herein as the generation of plasma associated with the stripping chamber, regardless of the precise location or type of the plasma generator.

After the first stripping step, the flow of $O_2$ may be increased from 1400 sccm (or its equivalence in a larger or smaller chamber) up to from about 2000 sccm to about 4000 sccm, typically about 3000 sccm, to flush out any remaining fluorocarbon gas prior to the next step of the process. This flushing step, which need only be carried out if fluorocarbons are used in the first step, is carried out for a minimum time period of at least about 10 seconds.

During this flushing step, the temperature of the wafer may be slowly ramped up, at a rate of about 10° C./second, to a temperature of from about 150° C. to about 400° C., typically from about 200° C. to about 245° C., at which temperature the wafer is maintained during the remainder of the process.

During the second stripping step, a mixture of $H_2O_2$ and $H_2O$ vapors is flowed through the plasma generator (when the plasma chamber is external to the stripping chamber) into the stripping chamber at a rate equivalent to from about 100 to about 500 sccm, preferably from about 200 sccm to about 400 sccm, and typically about 300 sccm, into a 5 liter chamber, while $O_2$ continues to flow through the plasma generator into the stripping chamber at an equivalent rate within the range of from about 2000 sccm to about 4000 sccm, preferably from about 2500 sccm to about 3500 sccm, and typically about 3000 sccm. Optionally $N_2$ gas may also be flowed through the plasma generator into the stripping chamber during this second step at a rate ranging of from 0 to about 500 sccm.

The initial $H_2O_2/H_2O$ liquid mixture comprises a mixture of from at least about 3 volume % to up to about 30 volume % $H_2O_2$, with the balance consisting essentially of $H_2O$. A vapor mixture may be prepared from this liquid mixture by placing the $H_2O_2/H_2O$ liquid mixture in a boiler outside of the stripping chamber and heating the liquid mixture to its boiling point and then feeding the resulting vapors into the stripping chamber. The volume percentage of vapors in the resulting vapor mixture fed into the stripping chamber will range from about 0.3 mole % up to about 3 mole % $H_2O_2$, with the balance consisting of $H_2O$.

If the liquid mixture of $H_2O_2/H_2O$ is not vaporized, but is, instead, injected into the stripping chamber as an aerosol, the amount of $H_2O_2$ in the injected mixture in the chamber will approximate the initial ratio of the liquid mixture.

The mixture of $H_2O_2/H_2O$ vapor, $O_2$ gas, and $N_2$ gas is flowed through the plasma generator into the stripping chamber during this second step for a period of at least about 5 seconds, after which a plasma is ignited in the plasma generator and maintained for a time period of from at least about 30 seconds, preferably at least about 75 seconds, up to about 4 minutes, during which the flow of the above gases through the plasma generator into the stripping chamber is maintained. Longer periods of time can be used, both for the gas flow prior to the plasma ignition, as well as the period during which the plasma remains on, but such longer periods are deemed to be unnecessary.

It will be appreciated that the total stripping time will be dependent upon the thickness of the photoresist layer and also on the sensitivity of the particular underlying metal(s) to chlorine corrosion.

After the plasma is extinguished and the flow of gases and vapors shut off, the wafer may be removed from the stripping chamber and subject to further processing, e.g., topside processing, as desired. The process of the invention removes all of the photoresist and also removes or inactivates a sufficient amount of any chlorine-containing residues remaining from prior metal etching to provide freedom from any corrosion for at least 24 hours following the resist removal process of the invention without any further processing, i.e., without any further rinsing or other chlorine-removal steps.

It should be pointed out that the structure may be passivated, i.e., the chlorine-induced corrosion arrested or inhibited, without complete removal of the photoresist layer at this stage. The process should, however, be carried out for at least about 30 seconds to achieve the desired passivation. In such case, completion of the stripping of the photoresist layer will be carried out later, i.e., before further topside processing.

To further illustrate the invention, a silicon wafer was provided with a layer of oxide thereon, a layer of aluminum containing 1 wt. % silicon and 0.5 wt. % copper was deposited over the oxide layer, and a photoresist mask formed over the metal layer. The metal layer was first conventionally etched through the photoresist mask using a mixture of $BCl_3$, $Cl_2$, and $N_2$ etchant gases in a 11.5 liter vacuum etch chamber.

The wafer, while still hot from the etch process, was then immediately transferred to a 5 liter stripping chamber where the photoresist mask was then stripped and the underlying metal passivated by removal or inactivation of any etch residues remaining from the metal etch step. The first step of the stripping process was carried out by first flowing a mixture of $O_2$, $CF_2$, and $N_2$ through a microwave plasma generator located upstream of the stripping chamber, and then into the chamber at a rate of 1400 sccm $O_2$, 45 sccm $CF_4$, and 100 sccm $N_2$, for a period of about 10 seconds during which a plasma was ignited in the plasma generator and maintained at a power level of about 1400 watts.

The plasma was then extinguished and the flow of $CF_4$ and $N_2$ shut off, while the flow of $O_2$ was increased to 3000 sccm to flush out any remaining $CF_4$ gases. During this flushing period the wafer was ramped up to a temperature of about 245° C. at a rate of about 10° C. per second, e.g., over about a 25 second period.

After the wafer reached 245° C., as measured by a thermocouple contacting the back of the wafer, an $H_2O_2/H_2O$ vapor mixture, comprising 1.2 volume % $H_2O_2$ vapor with the balance $H_2O$, was flowed through the plasma generator into the chamber at a rate of about 300 sccm, together with a $N_2$ flow of about 200 sccm, while the flow of $O_2$ continued at the same rate, i.e., about 3000 sccm, through the plasma generator into the stripping chamber. After about 10 seconds, the plasma was reignited in the plasma generator and maintained for about 120 seconds following which the flow of the gases and vapors was shut off and the plasma extinguished.

The wafer was then removed from the stripping chamber and allowed to stand in the open atmosphere for 24 hours. The wafer surface was then examined, using 500× light field and dark field optical microscopes, and a 50,000× scanning electron microscope (SEM). Such examinations indicated that all of the photoresist had been removed and no evidence of corrosion was found on the exposed metal surfaces.

The same results, with respect to corrosion prevention, may be achieved by carrying out only the second plasma stripping step, i.e., eliminating the $O_2/CF_4/N_2$ plasma stripping step, and carrying out the second plasma stripping step for only about 30 seconds. It will be noted, however, that this will necessitate a further stripping step, e.g., after the 24 hour period and prior to further topside processing.

Thus, the process of the invention results in either partial or complete removal of photoresist from the surface of an integrated circuit structure, after patterning of a metal layer beneath the resist mask; the remaining metal is passivated by removal or inactivation of any corrosion-producing residues remaining from the prior metal etch step.

Having thus described the invention what is claimed is:

1. A process for passivating an integrated circuit structure, to inhibit corrosion from chlorine residues remaining after a metal etch, while stripping photoresist remaining from said metal etch which comprises:
    a) optionally exposing said structure to one or more stripping gases; and
    b) then treating said structure for a period of at least about 30 seconds in a plasma containing a mixture of:
       (i) $O_2$ gas,
       (ii) a mixture of $H_2O_2/H_2O$, and
       (iii) optionally $N_2$ gas;
       to inhibit the formation of corrosion from chlorine-containing residues on said integrated circuit structure.

2. The process of claim 1 which further comprises carrying out said process in a stripping chamber and igniting a plasma associated with said stripping chamber during said step b).

3. The process of claim 2 wherein said plasma ignited during said step b) is maintained at a power level of from about 500 to about 2500 watts.

4. The process of claim 3 wherein said plasma is generated in a microwave plasma generator upstream of said stripping chamber.

5. The process of claim 3 wherein the ratio of $H_2O_2$ to $H_2O$ in said mixture of $H_2O_2/H_2O$ ranges from about 0.3 volume % $H_2O_2$ to about 30 volume % $H_2O_2$.

6. A process for stripping photoresist from an integrated circuit structure in a stripping chamber, while inhibiting corrosion from chlorine residues remaining after a metal etch, which comprises:
    a) exposing said structure to one or more stripping gases for a period of at least about 10 seconds; and
    b) then exposing said structure to a mixture of:
       (i) $O_2$ gas,
       (ii) a mixture of $H_2O_2/H_2O$, and
       (iii) optionally $N_2$ gas;
       in the form of a plasma for a period of at least about 30 seconds to inhibit the formation of corrosion from chlorine-containing residues on said integrated circuit structure.

7. The process of claim 6 wherein said plasma ignited during said step b) is maintained at a power level of from about 500 to about 2500 watts.

8. The process of claim 6 wherein said plasma is generated in a microwave plasma generator upstream of said stripping chamber.

9. The process of claim 6 wherein said mixture of $H_2O_2/H_2O$ is a liquid in aerosol form and the ratio of $H_2O_2$ to $H_2O$ in said mixture of $H_2O_2/H_2O$ ranges from about 3 mole % $H_2O_2$ to about 30 mole % $H_2O_2$.

10. The process of claim 6 wherein said mixture of $H_2O_2/H_2O$ is in the form of a vapor and the ratio of $H_2O_2$ to $H_2O$ in said mixture of $H_2O_2/H_2O$ vapor ranges from about 0.3 mole % $H_2O_2$ to about 3 mole % $H_2O_2$.

11. A process of claim 6 wherein said mixture of $H_2O_2/H_2O$ flows into said stripping chamber at a rate equivalent to a flow of from about 100 sccm to about 500 sccm into a 5 liter chamber.

12. The process of claim 6 wherein said $O_2$ gas and optional $N_2$ gas flow into said stripping chamber during said step b) at a rate equivalent to an $O_2$ flow of from about 2000 sccm to about 4000 sccm, and an $N_2$ flow of 0 to about 500 sccm into a 5 liter chamber.

13. The process of claim 6 which further comprises providing a plasma during said step a) maintained at a power level of from about 500 to about 2500 watts.

14. The process of claim 13 wherein said step a) comprises exposing said wafer to a stripping gas comprising a combination of $O_2$ gas and one or more fluorocarbon gases in the form of a plasma.

15. The process of claim 14 wherein said $O_2$ gas and said one or more fluorocarbon gases are flowed into said stripping chamber during said step a) at a rate equivalent to flowing from about 1000 sccm to about 4000 sccm of said $O_2$ gas and from about 20 sccm to about 80 sccm of said one or more fluorocarbon gases into a 5 liter chamber.

16. The process of claim 13 wherein said step a) further comprises exposing said wafer to a stripping gas comprising a combination of $O_2$ gas and $N_2$ gas.

17. The process of claim 16 wherein $O_2$ and $N_2$ gases are flowed into said stripping chamber during said step a) at a rate equivalent to flowing from about 1000 sccm to about 4000 sccm of said $O_2$ gas and from about 20 sccm to about 150 sccm of said $N_2$ gas into a 5 liter chamber.

18. The process of claim 6 wherein said wafer is maintained at a temperature of from about 100° C. to about 400° C. during said step b).

19. The process of claim 18 wherein said wafer is maintained at from about 40° C. to about 100° C. during said step a) and then heated to said step b) temperature range at a rate of about 10° C. per second.

20. The process of claim 6 wherein said stripping chamber is maintained at a pressure of from about 0.5 Torr to about 3 Torr during said process.

21. A process for removing, from an integrated circuit structure, photoresist remaining after a metal etch which comprises:
a) flowing into a stripping chamber containing said integrated circuit structure a mixture of $O_2$ and a further gas selected from the group consisting of $N_2$, and one or more fluorocarbon gases for a period of at least about 10 seconds;
b) igniting a plasma associated with said stripping chamber while said $O_2$ and said further gas are flowing into said stripping chamber;
c) extinguishing said plasma;
d) then flowing a mixture of $H_2O_2/H_2O$, $O_2$ gas, and $N_2$ gas into said stripping chamber at a rate equivalent to a flow of from about 100 sccm to about 500 sccm of said $H_2O_2/H_2O$, from about 1000 sccm to about 4000 sccm of said $O_2$ gas, and from 0 to about 500 sccm of $N_2$ gas into a 5 liter chamber for a period of at least about 30 seconds; and
e) igniting a plasma associated with said stripping chamber after said $H_2O_2/H_2O$, $O_2$, and $N_2$ begin flowing into said stripping chamber.

22. The process of claim 21 wherein said plasma in said step e) is maintained at a power level of from about 500 watts to about 2500 watts while said $H_2O_2/H_2O$, $O_2$, and $N_2$ are flowing into said stripping chamber.

23. The process of claim 21 wherein said step of flowing a mixture of $H_2O_2/H_2O$, $O_2$ gas, and $N_2$ gas into said stripping chamber is carried out for a period of from about 30 seconds to about 4 minutes.

24. A process for removing, from an integrated circuit structure, photoresist remaining after a metal etch, which process also removes or inactivates chlorine residues remaining from said previous metal etch, comprising:
a) flowing through a microwave plasma generator into a stripping chamber containing said integrated circuit structure a mixture of $O_2$ and one or more fluorocarbon gases for a period of at least about 10 seconds at a rate equivalent to flowing from about 1000 sccm to about 2000 sccm of said $O_2$ gas and from about 20 sccm to about 80 sccm of said fluorocarbon gas into a 5 liter chamber;
b) igniting a plasma in said microwave plasma generator and maintaining said plasma in said generator at a power level of from about 500 watts to about 2500 watts while said $O_2$ and one or more fluorocarbon gases are flowing through said plasma generator into said stripping chamber;
c) then extinguishing said plasma and shutting off said flow of said one or more fluorocarbon gases into said stripping chamber while maintaining said flow of $O_2$ into said chamber to purge said stripping chamber of said fluorocarbon gases;
d) then flowing a mixture of $H_2O_2/H_2O$ vapors, $O_2$ gas, and $N_2$ gas through said plasma generator into said stripping chamber at a rate equivalent to a flow of from about 100 sccm to about 500 sccm of $H_2O_2/H_2O$ vapors, from about 1000 sccm to about 4000 sccm of $O_2$, and from 0 to about 500 sccm of $N_2$ gas into a 5 liter chamber; and
e) igniting a plasma in said microwave plasma generator at least about 10 seconds after said vapors and gases begin flowing through said generator into said stripping chamber and maintaining said plasma at a power level of from about 500 watts to about 2500 watts for a period of at least about 30 seconds.

* * * * *